United States Patent [19]
Arai et al.

[11] Patent Number: 5,925,912
[45] Date of Patent: *Jul. 20, 1999

[54] SEMICONDUCTOR APPARATUS HAVING A CONDUCTIVE SIDEWALL STRUCTURE

[75] Inventors: Masatoshi Arai; Takashi Nakabayashi, both of Osaka, Japan

[73] Assignee: Matsushita Electric Industrial Co.,Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/622,108

[22] Filed: Mar. 26, 1996

[30] Foreign Application Priority Data

Mar. 27, 1995 [JP] Japan .................................. 7-067729

[51] Int. Cl.$^6$ .......................... H01L 29/76; H01L 29/94; H01L 23/58

[52] U.S. Cl. .......................... 257/344; 257/336; 257/408; 257/640; 257/641

[58] Field of Search .................................. 257/368, 336, 257/344, 408, 640, 641

[56] References Cited

U.S. PATENT DOCUMENTS 5,324,974  6/1994  Liao .......................................... 257/408

FOREIGN PATENT DOCUMENTS 63-168050   7/1988   Japan ..................................... 257/344
2-276251   11/1990   Japan ..................................... 257/368
3-278576   12/1991   Japan ..................................... 257/640
4-43649     2/1992   Japan ..................................... 257/408

*Primary Examiner*—Steven H. Loke
*Attorney, Agent, or Firm*—McDermott, Will & Emery

[57] ABSTRACT

In an active area on a semiconductor substrate is formed a MOS transistor including a gate insulating film, gate electrode, an insulating film formed on the entire surface of the substrate, a conductive side wall formed on the side surfaces of the gate electrode with the insulating film interposed therebetween, low concentration source/drain regions and high concentration source/drain regions. The high concentration drain region and the conductive side wall are electrically conducting to each other via a second interconnection within a second contact hole. In the usage of the MOS transistor, the conductive side wall is at the same potential as the drain voltage, thereby suppressing the degradation due to a hot carrier. In addition, since there is no need to provide an alignment margin between the second contact hole and the gate electrode, the area of the drain region is decreased. Thus, the invention provides a semiconductor apparatus which has a smaller active area and is suitable to refinement and a higher density, and a production method for the same.

5 Claims, 13 Drawing Sheets

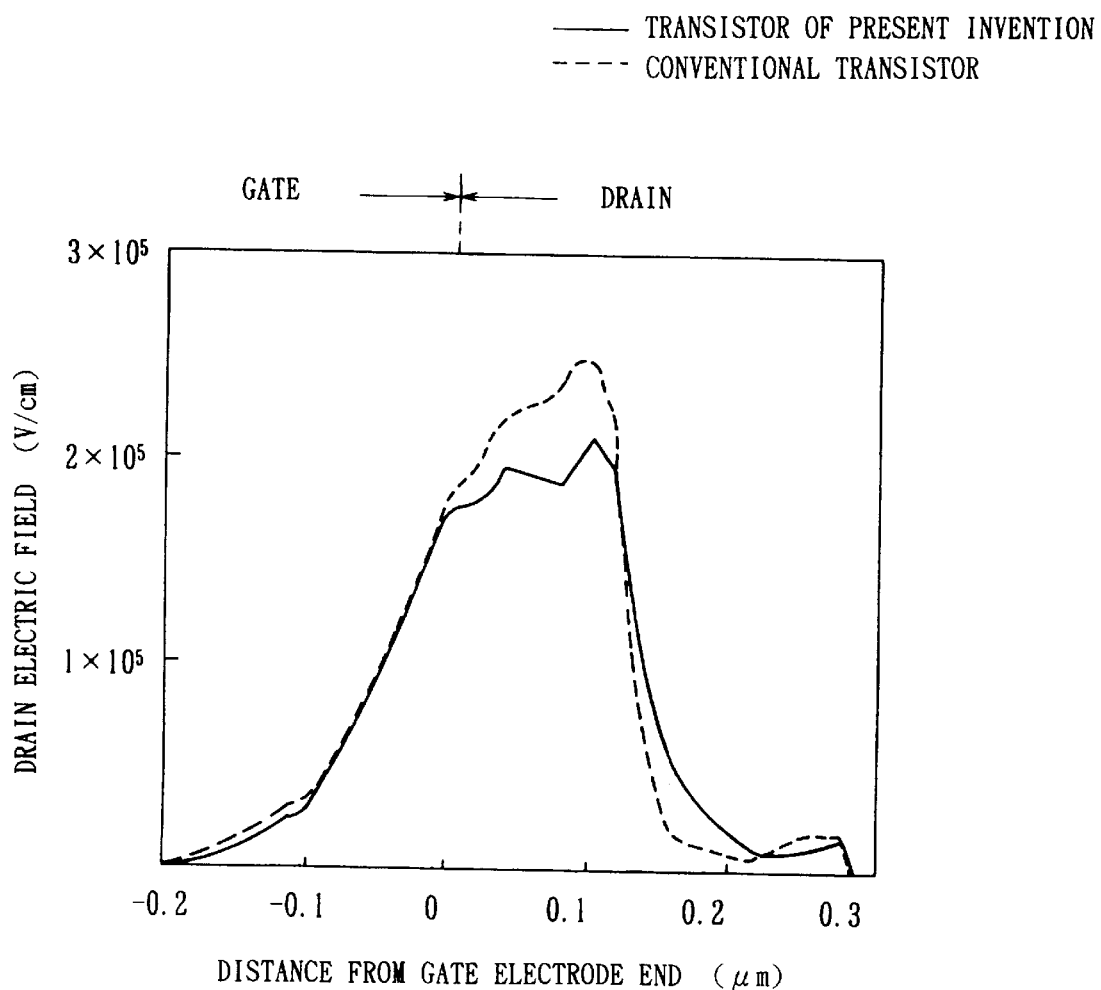

SEMICONDUCTOR APPARATUS HAVING A CONDUCTIVE SIDEWALL STRUCTURE

BACKGROUND OF THE INVENTION

The present invention relates to a semiconductor apparatus including a conductive side wall on the side surfaces of a gate electrode and a production method for the semiconductor apparatus, and more particularly, it relates to a measure for attaining refinement and a high density in a semiconductor apparatus.

A MOS semiconductor apparatus having a so-called LDD structure as shown in FIG. 10 is well known. This semiconductor apparatus comprises, in an active area surrounded by an isolation 108 formed on a semiconductor substrate 101, a gate oxide film 102, a gate electrode 103, insulating side walls 107 formed on side surfaces of the gate electrode 104, low concentration source/drain regions 105a and 105b formed in the semiconductor substrate 101 under the side walls 107, high concentration source/drain regions 109a and 109b formed on the outer sides of and adjacently to the low concentration source/drain regions 105a and 105b, first and second contact holes 111a and 111b formed through an interlayer insulating film 110 so as to respectively reach the high concentration source/drain regions 109a and 109b, and first and second interconnections 112a and 112b formed within the contact holes 111a and 111b and on the interlayer insulating film 110. The MOS semiconductor apparatus having such an LDD structure has an advantage that degradation due to a punch-through and a hot carrier can be suppressed even when a gate length is shortened, and is known to be advantageous for refinement. In spite of such a merit, the MOS semiconductor apparatus having the LDD structure as shown in FIG. 10 has an inherent disadvantage that a hot carrier is captured by the side wall 107 so as to deplete the surfaces of the low concentration source/drain regions 105a and 105b, resulting in degrading the characteristics of the transistor.

As a countermeasure against this disadvantage, a side wall of a conductive material is used to suppress the degradation due to a hot carrier as is described in, for example, Japanese Laid-Open Patent Publication No. 2-276251. The production method for a MOS semiconductor apparatus disclosed in this publication will now be described. FIGS. 11(a) through 11(c), 12(a) through 12(c) and 13(a) through 13(c) are plane views showing the production procedures, sectional views in an active area and sectional views in an isolation.

First, as is shown in FIGS. 11(a) through 11(c), an isolation 122 is formed on a semiconductor substrate 121 so as to surround an active area. On the active area in the semiconductor substrate 121 is formed a MOS transistor including a gate oxide film 123, a gate electrode 124 of polysilicon, an insulating film 125, side walls 126 of polysilicon, a source region 127 and a drain region 128 doped with an impurity at a high concentration. In this exemplified transistor, no low concentration source/drain region is formed below the side wall 126.

Then, as is shown in FIGS. 12(a) through 12(c), a polysilicon film is deposited and selectively etched, thereby forming a connection layer 129 stretching over the insulating film 125 on the isolation 122 so as to connect the side walls 126. On the active area, however, the connection layer 129 remains not on the source region 127 but on the drain region 128.

Next, as is shown in FIGS. 13(a) through 13(c), an interlayer insulating film 132 is deposited on the entire surface of the resultant substrate, and then a contact hole 133 is formed through the interlayer insulating film 132 so as to reach the connection layer 129 on the drain region 128. Furthermore, an Al interconnection 130 is formed within the contact hole 133 and on the interlayer insulating film 132.

In the MOS transistor disclosed in this publication, the side wall 126 is made of a conductive material, and the drain region 128 and the side wall 126 are connected via the connection layer 129. Therefore, the side wall 126 is retained at the same potential as the drain region 128. Thus, an electric field in the vicinity of the drain region 128 in the semiconductor substrate is relaxed, thereby suppressing the degradation due to a hot carrier.

However, there have recently been more and more demands for refinement and a higher density of a MOS semiconductor apparatus, and the aforementioned structure of the MOS semiconductor apparatus cannot meet the demands.

For example, in the MOS semiconductor apparatus shown in FIG. 10, when a designing rule of 0.25 $\mu$m or less is adopted, the gate length can be minimized to 0.25 $\mu$m or less but the widths of the source/drain regions 107a and 107b cannot be sufficiently minimized because it is necessary to provide a margin (hereinafter referred to as the alignment margin) in consideration of a shift between a mask for forming a gate electrode and a mask for forming a contact hole.

On the other hand, in the structure disclosed in the aforementioned publication, the connection layer 129 is required to have a larger size than the contact hole 133 as is shown in FIG. 13(b). In addition, this structure requires not only the alignment margin between the gate electrode and the contact hole but also another alignment margin between the connection layer and the gate electrode. Therefore, the area occupied by the drain region 128 is further larger than that of the transistor having the LDD structure shown in FIG. 10. This can result in a reverse movement to the demands for refinement and a higher density.

SUMMARY OF THE INVENTION

The present invention was devised to overcome the aforementioned problems. The object of the invention is providing a MOS semiconductor apparatus which is refined and has a high density suitably to a designing rule of 0.25 $\mu$m or less, in which a side wall is made of a conductive material and the area of source/drain regions is decreased so as to suppress the characteristic degradation due to a hot carrier, and also providing a production method for the semiconductor apparatus.

The semiconductor apparatus of this invention comprises at least one MOS transistor disposed on an active area surrounded by an isolation formed on a semiconductor substrate. The MOS transistor includes a gate insulating film formed in the active area surrounded by the isolation on the semiconductor substrate; a gate electrode formed on the gate insulating film; an insulating film formed so as to stretch over entire side surfaces of the gate electrode and the semiconductor substrate in the active area; a side wall made of a conductive material formed on the entire side surfaces of the gate electrode with the insulating film interposed therebetween; and a source region and a drain region formed by introducing an impurity into the active area on both sides of the gate electrode. The semiconductor apparatus further comprises an interlayer insulating film formed on an area stretching over the gate electrode, the semiconductor substrate and the isolation; a first contact hole formed through the interlayer insulating film so as to reach the source region; a second contact hole formed through the interlayer insulating film so as to reach the drain region and the conductive side wall; and first and second contact members made of a conductive material deposited within the first and second contact holes.

Owing to this configuration, the side wall is electrically conducting to the drain region via the second contact member, and hence, the side wall is supplied with a voltage equal to the drain voltage in the usage of the MOS transistor. As a result, the drain electric field in the semiconductor substrate directly below the side wall is relaxed, thereby decreasing a generation ratio of a hot carrier. Furthermore, in the vicinity of the source region, the surface of the semiconductor substrate directly below the side wall is supplied with a conductive carrier, thereby suppressing the surface of the substrate from being depleted by a hot carrier captured by the side wall. Additionally, since the side wall is made of a conductive material, a hot carrier captured by the side wall via the insulating film on the semiconductor substrate moves through the contact member, resulting in remaining no capture layer. Accordingly, the characteristics of the semiconductor apparatus are prevented from being degraded by a hot carrier.

Furthermore, since the second contact member is formed on the side wall, there is no need to provide a space corresponding to an alignment margin between the side wall and the second contact member. This can decrease the active area in the vicinity of the drain region.

It is preferred that the side wall has a thickness at its bottom of twice or more as large as an alignment margin between the gate electrode and the second contact hole.

In this case, the second contact member can be securely connected to the drain region and the side wall without coming in contact with the gate electrode.

Furthermore, it is preferred that the side wall has a thickness at its bottom of 150 nm or more.

In this case, the second contact member can be securely connected to the drain region and the side wall without coming in contact with the gate electrode in consideration of an alignment margin required in a designing rule of 0.25 $\mu$m or less.

The semiconductor apparatus can further comprise a gate protection film formed on the gate electrode and made of an insulating material having high etching selectivity against the interlayer insulating film.

Owing to this configuration, the second contact hole is prevented from reaching the gate electrode by the gate protection film even when the second contact hole is formed in an area above the gate electrode. Therefore, there is no need to provide an alignment margin between the gate electrode and the second contact hole, and this can decrease an area required as the active area in the vicinity of the drain region.

The semiconductor apparatus can further comprise a gate protection film formed on the gate electrode and made of an insulating material; and an entire protection film formed on the gate electrode, the active area and the isolation and made of an insulating material having high etching selectivity against the isolation and the gate protection film, and the first and second contact holes are formed through the interlayer insulating film and the entire protection film.

Owing to this configuration, the second contact hole is prevented from reaching the gate electrode by the gate protection film even when the second contact hole is formed in an area above the gate electrode in the vicinity of the drain region. Therefore, an area required as the active area in the vicinity of the drain region can be similarly decreased. Furthermore, the first and second contact holes are prevented from reaching the isolation by the entire protection film even when the contact holes are formed in areas above the isolation in the vicinity of the drain and source regions. Therefore, there is no need to provide an alignment margin between the contact holes and the isolation in the source and drain regions, and thus, the active area can be largely decreased.

It is preferred that the isolation and the gate protection film are made of a silicon oxide film and that the entire protection film is made of a silicon nitride film.

In this case, high etching selectivity can be securely attained between the isolation and the gate protection film.

It is possible to provide two MOS transistors each having the aforementioned configuration in the active area, to dispose the gate electrodes of the respective MOS transistors parallel to each other, to form a commonly used drain region in the active area between the gate electrodes of the transistors, and to make the second contact hole of each transistor reach the commonly used drain region and the side wall of the transistor.

Owing to this configuration, the active area can be decreased also in a semiconductor apparatus including two transistors formed in one active area and a commonly used drain region, like a memory cell transistor of a DRAM.

The production method for a semiconductor apparatus of this invention comprises a first step of forming an isolation on a semiconductor substrate so as to surround an active area; a second step of forming a gate insulating film and a gate electrode on the gate insulating film in the active area on the semiconductor substrate; a third step of forming an insulating film on an entire surface of the substrate; a fourth step of forming a side wall on entire side surfaces of the gate electrode by depositing a first conductive film on the insulating film and etching back the first conductive film by anisotropic etching; a fifth step of forming a source region and a drain region by introducing an impurity into the substrate on both sides of the gate electrode; a sixth step of depositing an interlayer insulating film on the entire surface of the semiconductor substrate; a seventh step of forming a first contact hole through the interlayer insulating film so as to reach the source region and a second contact hole through the interlayer insulating film so as to reach the drain region and the side wall; and an eighth step of forming first and second contact members by depositing a conductive material within the first and second contact holes.

In adopting this method, the conductive side wall and the drain region are electrically conducting to each other via the second contact member because the second contact hole formed in the seventh step reaches both the side wall and the drain region. Therefore, the aforementioned semiconductor apparatus can be manufactured by this method.

Furthermore, in order to realize the respective embodiments of the above-described semiconductor apparatus, the procedures in the respective step can be appropriately selected or an additional step can be added to the production method.

BRIEF DESCRIPTION OF THE DRAWINGS

FIG. 2 is a graph showing the result of simulation with regard to distribution of a drain electric field in an active area in the vicinity of a drain region;

DETAILED DESCRIPTION OF THE INVENTION

Embodiment 1

FIGS. 1(a) through 1(f) are sectional views for showing production procedures for a semiconductor apparatus of the first embodiment of this invention.

Figure 1A:
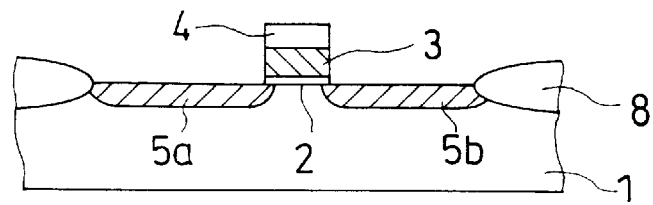
FIGS. 1(a) through 1(f) are sectional views for showing production procedures for a MOS semiconductor apparatus of a first embodiment of the invention.

First, in the procedure shown in FIG. 1(a), an isolation 8 is formed on a semiconductor substrate 1 of silicon by a LOCOS (local oxidation of silicon) method. On an active area surrounded by the isolation 8, a silicon oxide film with a thickness of approximately 10 nm, a first polysilicon film with a thickness of approximately 150 nm and another silicon oxide film with a thickness of approximately 150 nm are successively deposited, and these films are made into a pattern by photolithography and dry etching. As a result, a gate oxide film 2, a gate electrode 3 and a gate protection film 4 are formed. At this point, the gate electrode 3 has a gate length of approximately 0.25 $\mu$m. Then, by using the gate electrode and the like as masks, n-type impurity ions are injected into the active area at a low concentration, thereby forming a low concentration source region 5a and a low concentration drain region 5b on both the sides of the gate electrode 3 in the active area.

Figure 1B:
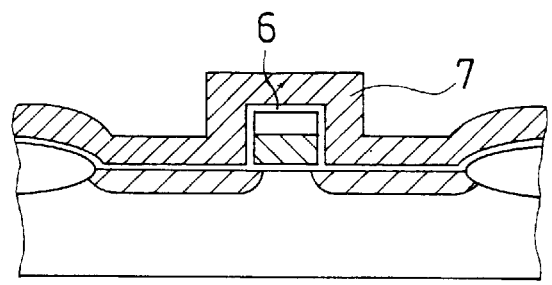

Next, in the procedure shown in FIG. 1(b), a silicon oxide film 6 with a thickness of approximately 10 nm and a second polysilicon film 7 with a thickness of approximately 200 nm are successively deposited on the entire surface of the resultant substrate.

Figure 1C:
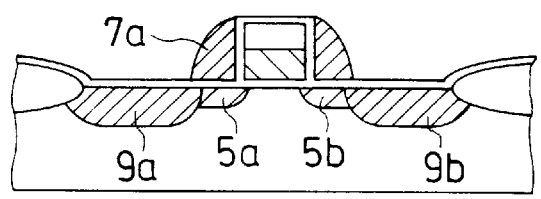

In the procedure shown in FIG. 1(c), the second polysilicon film 7 alone is etched back by anisotropic etching, thereby forming a conductive side wall 7a on the entire side surfaces of the gate electrode 3 and the gate protection film 4. At this point, the horizontal dimension at the bottom of the conductive side wall 7a (i.e., the thickness of a side wall film) is substantially equal to 200 nm, that is, the thickness of the deposited second polysilicon film 7. This thickness is set to be approximately twice as large as an alignment margin required in consideration of the shift between a mask for forming a gate electrode and a mask for forming a contact hole. Furthermore, the conductive side wall 7a is integrally formed on the entire side surfaces of the gate electrode 4a by etch back, and is electrically conductive between a portion in the vicinity of the source region and a portion in the vicinity of the drain region.

Then, by using the gate electrode 3 and the conductive side wall 7a as masks, the n-type impurity ions are injected at a high concentration into the area which has been doped with the impurity at a low concentration, thereby forming a high concentration source region 9a and a high concentration drain region 9b. As a result, the locations of the low concentration source/drain regions 5a and 5b and the high concentration source/drain regions 9a and 9b on the outer sides thereof are substantially defined.

Figure 1D:
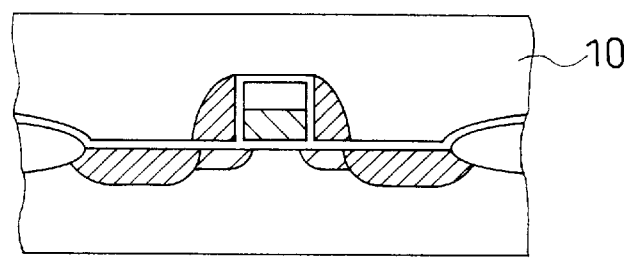

Next, in the procedure shown in FIG. 1(d), an interlayer insulating film 10 of a silicon oxide film with a thickness of approximately 700 nm is deposited on the entire surface of the resultant substrate.

Figure 1E:
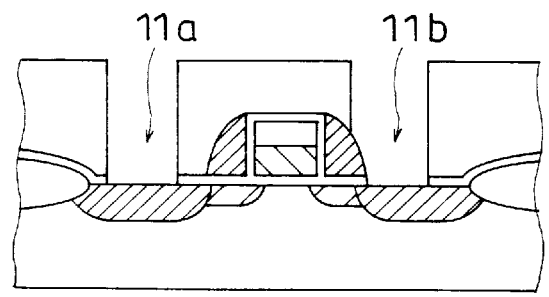

In the procedure shown in FIG. 1(e), first and second contact holes 11a and 11b are formed through the interlayer insulating film 10 so as to reach the high concentration source region 9a and the high concentration drain region 9b, respectively. At this point, the first contact hole 11a is formed so as not to come in contact with the conductive side wall 7a but to expose the high concentration source region 9a alone, while the second contact hole 11b is formed so as to expose both the high concentration drain region 9b and the conductive side wall 7a. The contact holes 11a and 11b have a dimension along the gate length of approximately 0.4 $\mu$m.

Figure 1F:
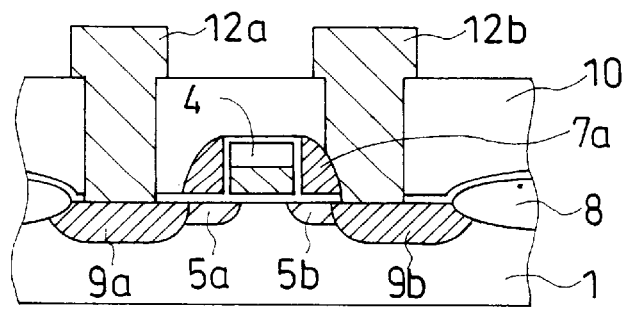

Then, in the procedure shown in FIG. 1(f), a metallic film of tungsten, aluminum or the like is deposited within the contact holes 11a and 11b and on the interlayer insulating film 10, and is then selectively etched, thereby forming first and second interconnections 12a and 12b serving as contact members and upper layer interconnections. At this point, the first interconnection 12a is in contact with the high concentration source region 9a alone but the second interconnection 12b is in contact with both the high concentration drain region 9b and the conductive side wall 7a.

In the present MOS semiconductor apparatus thus manufactured, the second interconnection 12b is connected to the conductive side wall 7a, and hence, the conductive side wall 7a is at the same potential as the high concentration drain region 9b in the vicinity of the source region as well as the drain region. Therefore, the drain electric field in the semiconductor substrate is relaxed, thereby suppressing the characteristic degradation of the semiconductor apparatus due to a hot carrier.

Figure 10:
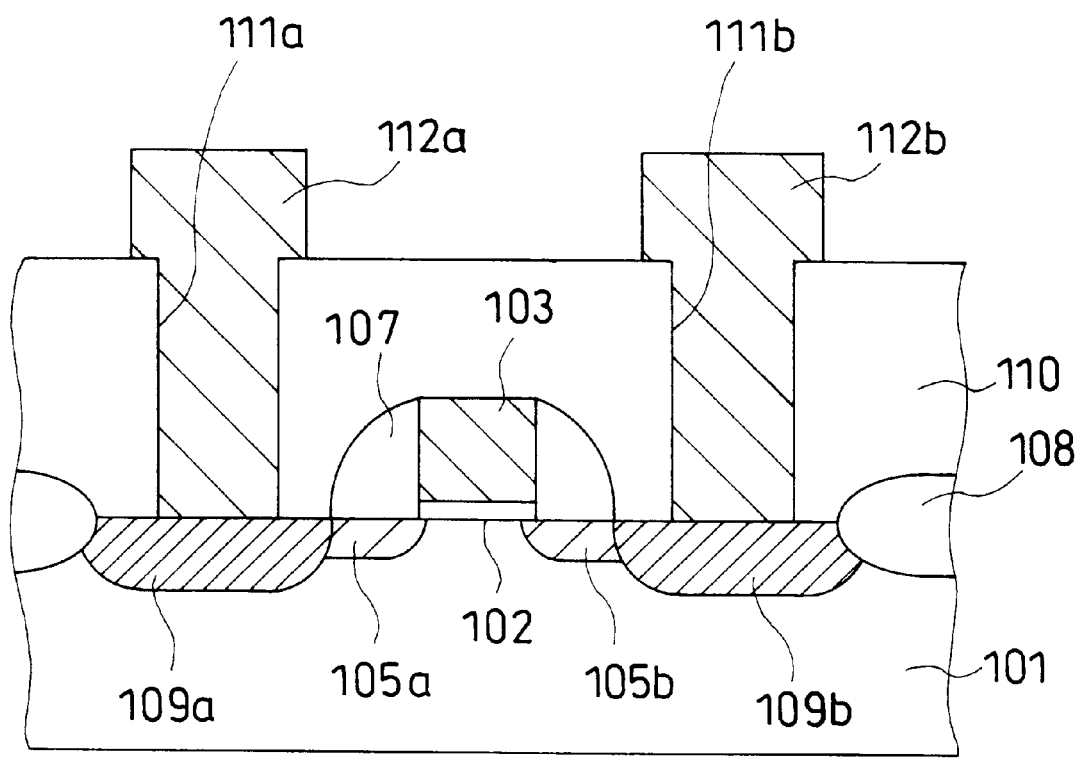
FIG. 10 is a sectional view of a MOS semiconductor apparatus having a conventional LDD structure.

FIG. 2 shows the result of simulation with regard to drain electric field distribution in the MOS transistor having the LDD structure of this embodiment and in the MOS transistor having the conventional LDD structure shown in FIG. 10. In FIG. 2, the abscissa indicates a horizontal location assuming that a position directly below the edge of the gate electrode 3 near the drain region being "0" and the direction from this position toward the drain region being the positive direction, and the ordinate indicates a drain electric field (V/cm) at a fixed depth in the semiconductor substrate. In this simulation, the gate electrode 3 has a gate length of 0.4 μm, which is equal to that in the conventional structure, the drain voltage VD is 6 V, and the gate voltage VG is 1.3 V.

As is shown in FIG. 2, the peak value of the drain electric field in the MOS transistor having the conventional LDD structure is approximately $2.4 \times 10^5$ (V/cm), while that of the MOS transistor having the LDD structure of this embodiment is approximately $2.0 \times 10^5$ (V/cm), which is lower than the conventional value by approximately 20%. In the LDD structure including low concentration source/drain regions, the drain electric field is generally maximized at a position below the side wall near the gate electrode. However, the conductive side wall 7a on the low concentration drain region 5b is at the same potential as the high concentration drain region 9b in the present MOS transistor, and therefore, the drain electric field can be largely decreased.

When a drain electric field is indicated as Ex (wherein x indicates the direction along the abscissa of FIG. 2) and a drain current is indicated as Id, a hot carrier generation ratio F is generally represented by the following expression:

$$F = A \int Id \exp(-B/Ex) \, dx$$

wherein A and B indicate positive constants. Therefore, when the peak value of the drain electric field Ex is lowered by 20% as described above, the hot carrier generation ratio F is largely decreased. In other words, a time period until the characteristic degradation such as variation of mutual conductance and a threshold voltage is caused by a hot carrier can be largely extended.

Furthermore, a conductive carrier is supplied to the surface of the low concentration source region 5a on the semiconductor substrate by applying the drain voltage VD to the conductive side wall 7a on the low concentration source 5a. Therefore, the surface of the substrate is prevented from being depleted by a hot carrier captured by the conductive side wall 7a on the low concentration source region 5a. In addition, since the drain voltage VD is applied to the conductive side wall 7a on the low concentration source/drain regions 5a and 5b, even when a hot carrier is captured by the conductive side wall 7a, the carrier is drawn via the second interconnection 12b and is prevented from being stored. As a result of these advantages, the degradation of the characteristics due to a hot carrier can be suppressed and the reliability can be largely improved.

Furthermore, in the MOS semiconductor apparatus having the LDD structure of this embodiment, the total area of the low concentration drain region 5b and the high concentration drain region 9b (hereinafter referred to as the drain region) can be largely decreased. This will now be described in detail.

Figure 3A:
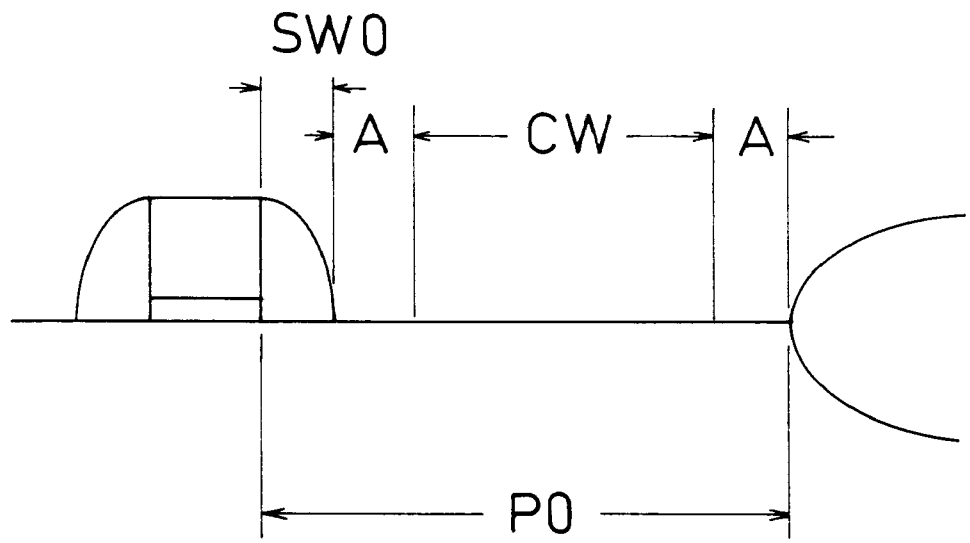
FIGS. 3(a) and 3(b) are sectional views for comparing widths of the drain regions required in the MOS transistor of the first embodiment and a conventional MOS transistor.
Figure 3B:
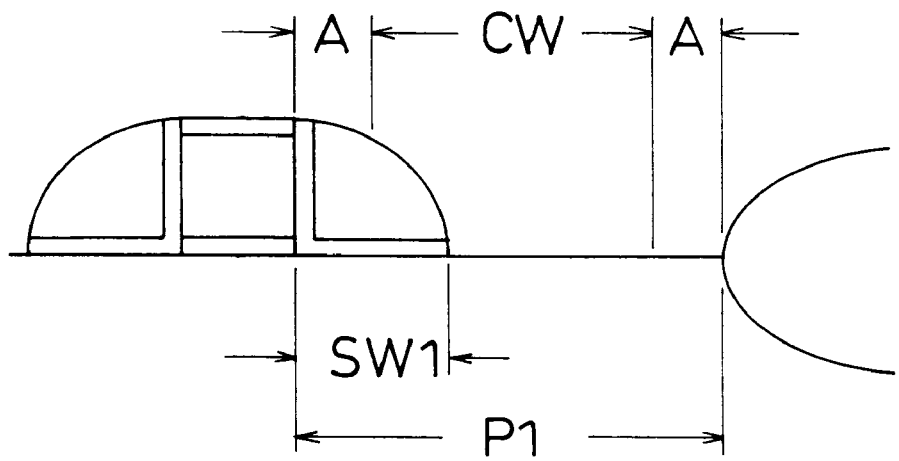

FIGS. 3(a) and 3(b) are sectional views in which the drain region of the MOS transistor having the conventional LDD structure shown in FIG. 10 is compared with that of the MOS transistor having the LDD structure of this embodiment. In FIGS. 3(a) and 3(b), the widths of the side walls in the conventional transistor and the present transistor are indicated as SW0 and SW1, respectively, the dimension of the second contact hole along the gate length is indicated as CW, and the alignment margin between the gate electrode and the second contact hole is indicated as A.

As is shown in FIG. 3(a), in the conventional MOS transistor, the reliability is degraded when the contact hole reaches part of the side wall and the isolation. Therefore, a distance P0 between the edge of the gate electrode and the edge of the isolation, that is, the width of the drain region, is required to satisfy the following relationship:

$$P0 \geq SW0 + 2A + CW$$

Figure 11A:
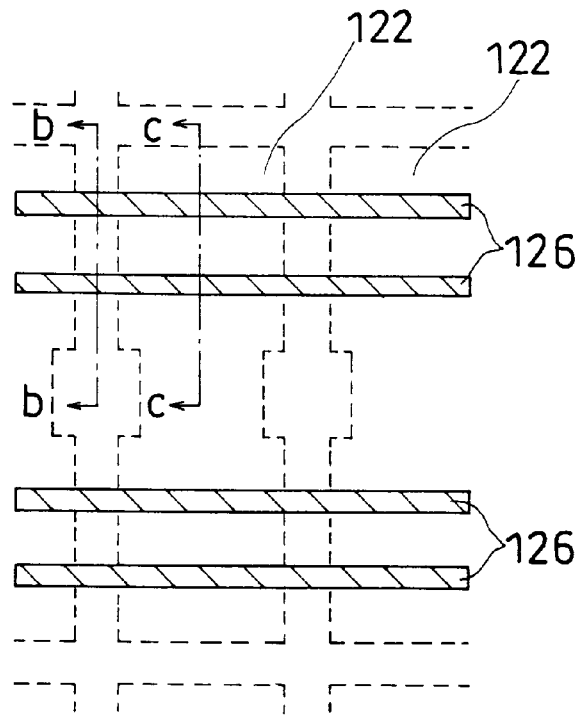
FIGS. 11(a) through 11(c) are respectively a plane view showing a structure after forming an electrode, a sectional view in an active area and a sectional view in an isolation of a MOS semiconductor apparatus having a conventional LDD structure disclosed in a publication.
Figure 11B:
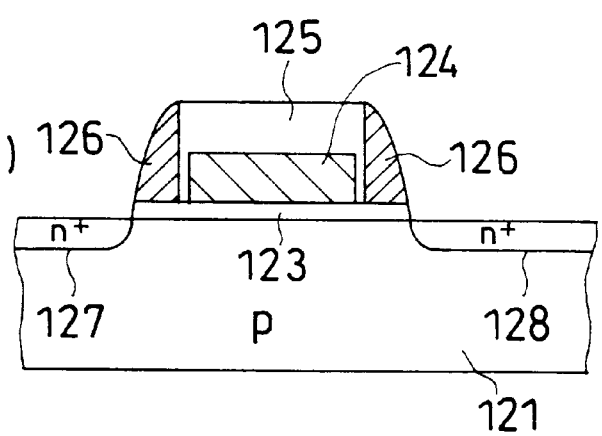
Figure 11C:
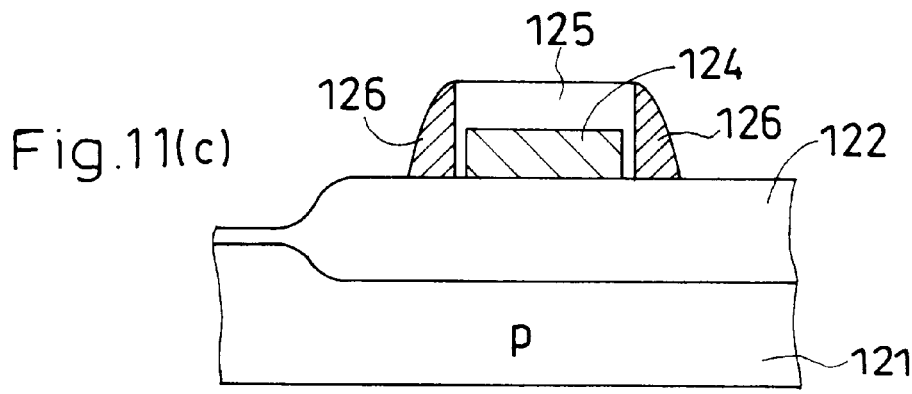
Figure 12A:
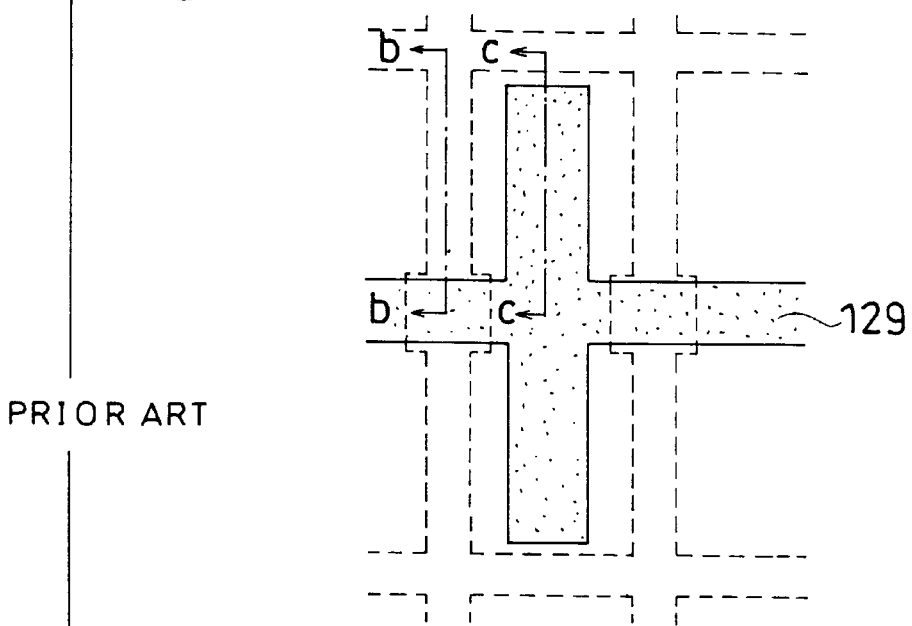
FIGS. 12(a) through 12(c) are respectively a plane view showing a structure after forming a connection layer, a sectional view in the active area and a sectional view in the isolation of the MOS semiconductor apparatus having the conventional LDD structure disclosed in the publication.
Figure 12B:
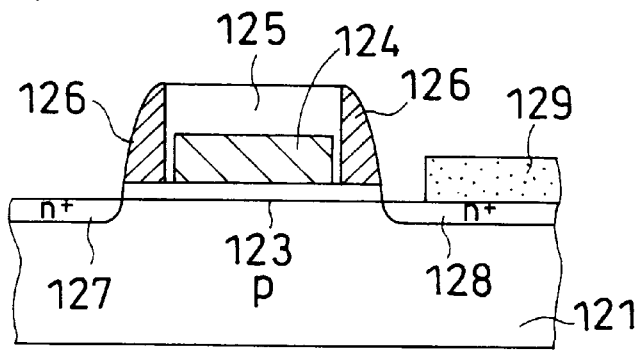
Figure 12C:
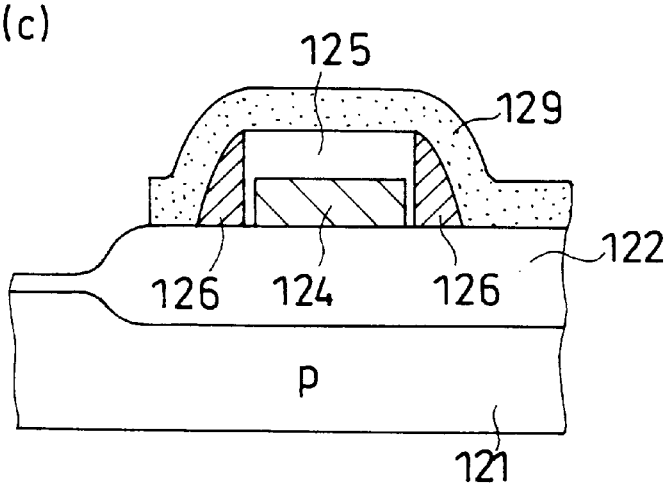
Figure 13A:
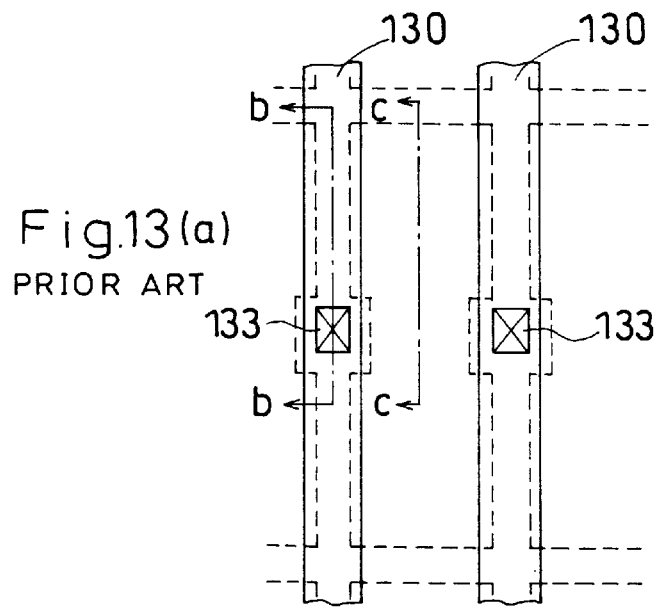
FIGS. 13(a) through 13(c) are respectively a plane view showing a structure after forming a contact member and an interconnection, a sectional view in the active area and a sectional view in the isolation of the MOS semiconductor apparatus having the conventional LDD structure disclosed in the publication.
Figure 13B:
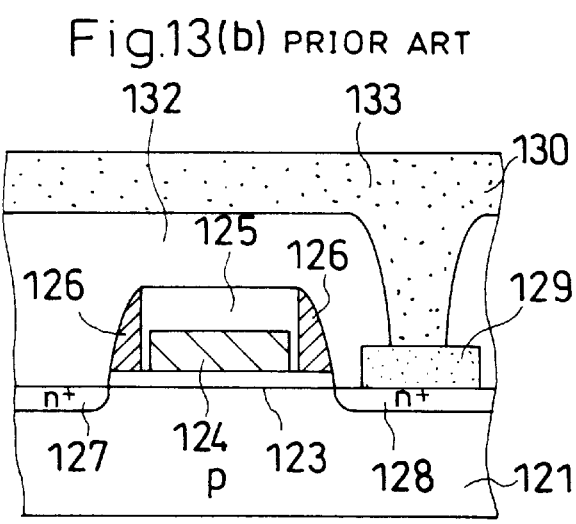
Figure 13C:
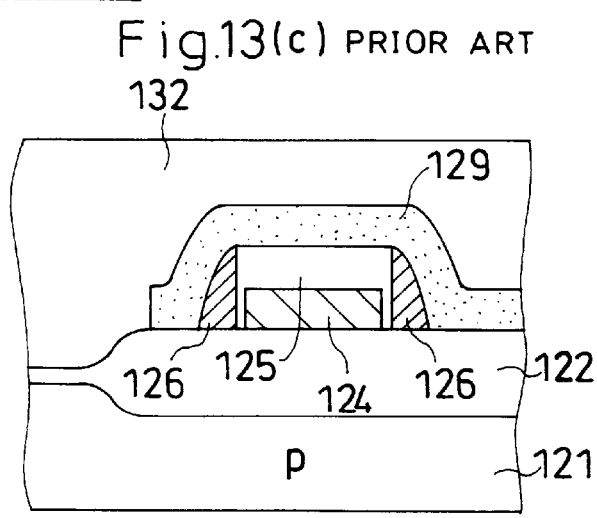

On the other hand, in the present MOS transistor shown in FIG. 3(b), the contact hole is required to stretch over the conductive side wall and the high concentration drain region. Therefore, a distance P1 between the edge of the gate electrode and the edge of the isolation is required to satisfy the following relationship:

$$P1 \geq 2A + CW$$

whereas $SW1 \geq 2A$. Accordingly, in the present MOS transistor, the width of the drain region can be decreased by the thickness SW0 of the conventional side wall film (specifically, approximately 100 to 120 nm) as compared with that in the MOS transistor having the conventional LDD structure shown in FIG. 10. In addition, in the MOS transistor having the LDD structure according to the aforementioned publication manufactured through the procedures shown in FIGS. 11 through 13, a required alignment margin is much larger than the alignment margin A of the MOS transistor shown in FIG. 10 in consideration of the mask shift in the formation of the connection layer and the contact hole. Therefore, the drain region is increased, which is a reverse movement to the demands for the refinement and higher density. The alignment margin A in the present MOS transistor is equal to that in the MOS transistor shown in FIG. 10.

Now, the widths of the drain regions in the conventional MOS transistor shown in FIG. 10 and the present MOS transistor will be specifically compared using a designing rule of 0.25 μm. In the conventional MOS transistor shown in FIG. 10, when the width SW0 of the side wall is 0.1 μm, the alignment margin A is 0.1 μm and the dimension CW of the contact hole is 0.4 μm, the distance P0 between the edges of the gate electrode and the isolation is 0.7 μm. In the present MOS transistor, the distance P1 between the edges of the gate electrode and the isolation under the same conditions is 0.6 μm, which is smaller than the distance P0, i.e., 0.7 μm, by 0.1 μm. However, there is no difference in the width of the source region between these transistors. As a result, the present transistor can decrease the area of the entire semiconductor apparatus by 10% under the designing rule of 0.25 μm. Thus, this embodiment exhibits a remarkable effect in increasing the density.

The alignment margin is assumed to be 0.1 μm to determine the dimensions and the thicknesses of other elements in the above description, and this alignment margin is selected taking an alignment margin adopted in the current mass-production into consideration. Since various techniques have been proposed to minimize the mask shift and improve the accuracy in the photolithography, a MOS transistor can be manufactured with an alignment margin of as small as 0.075 μm even at present if a high production cost can be ignored. Therefore, when the thickness of the conductive side wall 7a is 150 nm or more, the effect of this embodiment can be exhibited without fail.

However, taking the alignment margin adopted in the current mass-production into consideration, the thickness of the conductive side wall 7a is more preferably 200 nm or more.

Embodiment 2

The second embodiment of the invention will now be described referring to FIGS. 4(a) through 4(f), which are sectional views for showing the production procedures for a semiconductor apparatus of this embodiment.

The production procedures in this embodiment are basically similar to those of the first embodiment shown in FIGS. 1(a) through 1(f).

Figure 4A:
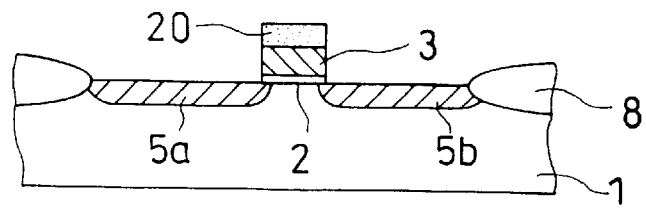
FIGS. 4(a) through 4(f) are sectional views for showing production procedures for a MOS semiconductor apparatus of a second embodiment of the invention.

However, in the procedure shown in FIG. 4(a), a silicon oxide film is not used but a silicon nitride film is used to form a gate protection film 20 with a thickness of approximately 150 nm.

Figure 4B:
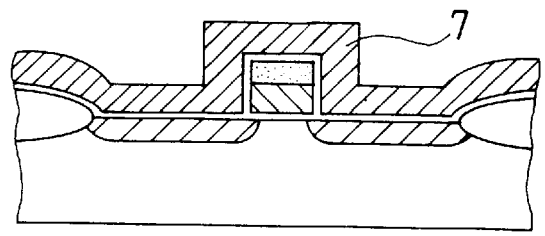
Figure 4C:
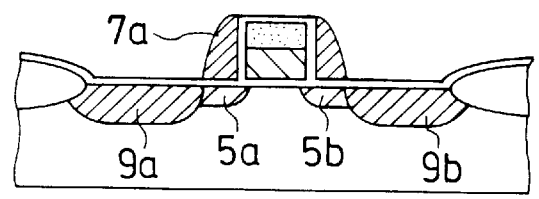
Figure 4D:
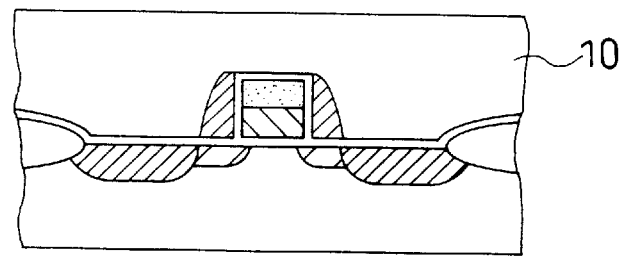

In the procedure shown in FIG. 4(b), a second polysilicon film 7 with a thickness of approximately 100 nm is deposited, and in the procedure shown in FIG. 4(c), a conductive side wall 7a having a thickness at the bottom thereof of 100 nm is formed.

Figure 4E:
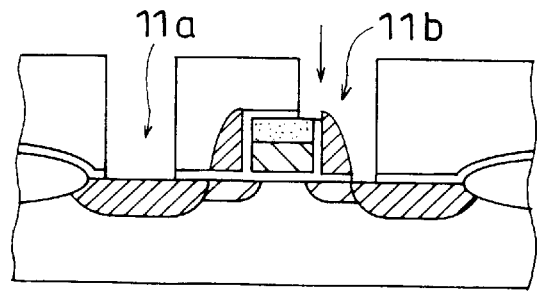
Figure 4F:
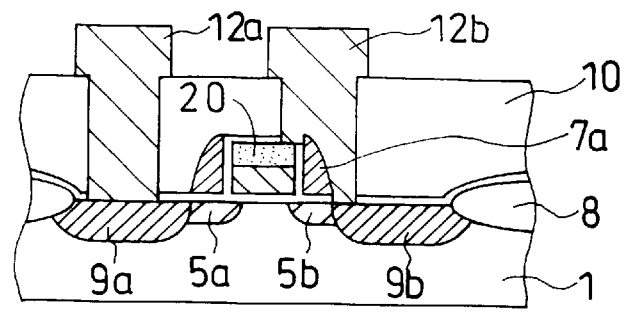

In this embodiment, even though a second contact hole 11b is formed also in an area above a gate electrode 3 in the procedure shown in FIG. 4(e), the second contact hole 11b does not reach the gate electrode 3 because of high etching selectivity between the silicon nitride film forming the gate protection film 20 and a silicon oxide film forming an interlayer insulating film 10.

Figure 5:
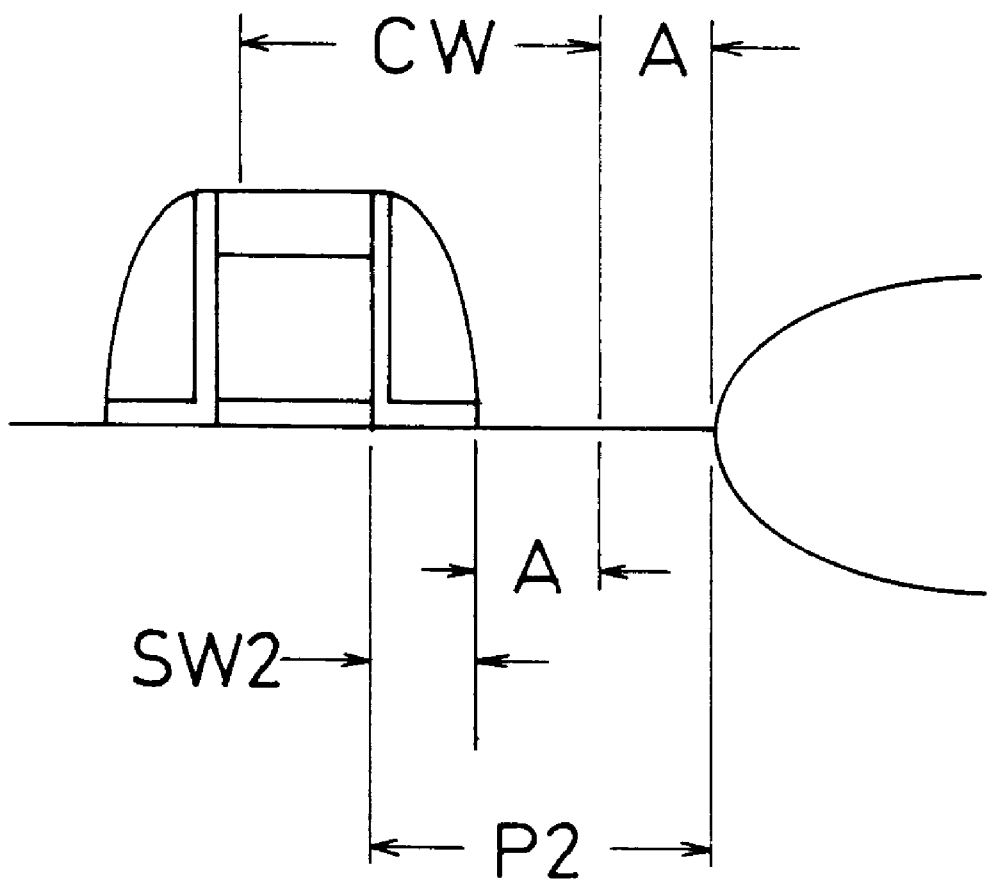
FIG. 5 is a sectional view for showing a width of a drain region required in the MOS transistor of the second embodiment.

Accordingly, the width of the drain region can be further decreased in this embodiment than in the first embodiment. Specifically, a width P2 of the drain region required in this embodiment is, as is shown in FIG. 5, required to satisfy the following relationship:

$$P2 \geq SW2 + 2A$$

wherein SW2 indicates the thickness of the side wall in this embodiment. Thus, the width P2 of the drain region in this embodiment is defined not by the dimension CW along the gate length of the contact hole 11b as in the first embodiment but by the thickness SW2 of the side wall. In this case, the thickness SW2 of the side wall in this embodiment is not required to be twice or more as large as the alignment margin A, differently from the first embodiment. Specifically, the thickness SW2 of the side wall is approximately 100 nm, and hence, the width P2 of the drain region is 0.3 μm. In this manner, the MOS semiconductor apparatus of this embodiment can attain higher refinement and a higher density than the MOS semiconductor apparatus of the first embodiment.

Embodiment 3

The third embodiment of the invention will now be described referring to FIGS. 6(a) through 6(f), which are sectional views for showing the production procedures for a semiconductor apparatus of this embodiment.

Figure 6A:
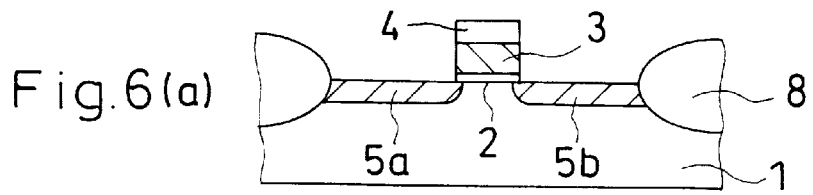
FIGS. 6(a) through 6(f) are sectional views for showing production procedures for a MOS semiconductor apparatus of a third embodiment of the invention.

First, in the procedure shown in FIG. 6(a), an isolation 8 is formed on a semiconductor substrate of silicon by the LOCOS (local oxidation of silicon) method. On an active area surrounded by the isolation 8, a silicon oxide film with a thickness of approximately 10 nm, a first polysilicon film with a thickness of approximately 150 nm and another silicon oxide film with a thickness of approximately 150 nm are successively deposited, and these films are made into a pattern by the photolithography and dry etching, thereby forming a gate oxide film 2, a gate electrode 3 and a gate protection film 4. At this point, the gate electrode 3 has a gate length of approximately 0.25 μm. Then, by using the gate electrode 3 and the like as masks, n-type impurity ions are injected into the active area, thereby forming low concentration source/drain regions 5a and 5b on the both sides of the gate electrode 3 in the active area.

Figure 6B:
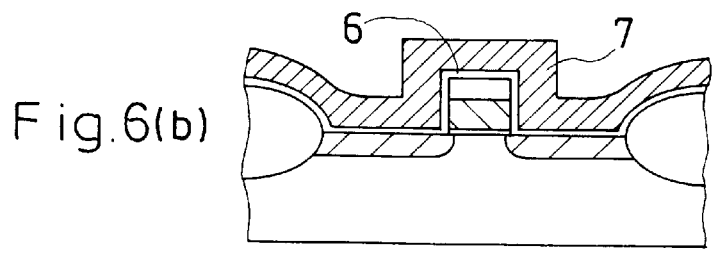

Next, in the procedure shown in FIG. 6(b), a silicon oxide film 6 with a thickness of approximately 10 nm and a second polysilicon film 7 with a thickness of approximately 100 nm are successively deposited.

Figure 6C:
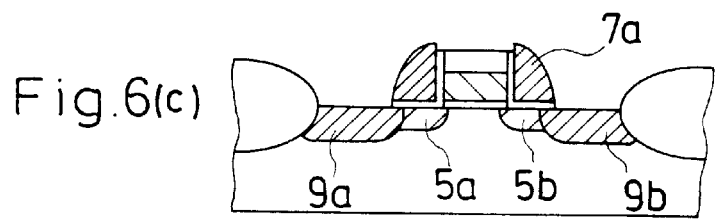

In the procedure shown in FIG. 6(c), the polysilicon film 7 alone is etched back by the anisotropic etching, thereby forming a conductive side wall 7a on side surfaces of the gate electrode 3 and the gate protection film 4. At this point, the thickness of the conductive side wall 7a at the bottom thereof (that is, the thickness of the side wall film) is substantially equal to the thickness of the deposited second polysilicon film 7, i.e., 100 nm, and this thickness is set regardless of the alignment margin A between the gate electrode and the contact hole. In addition, the conductive side wall 7a is integrally formed on the entire side surfaces of the gate electrode 4a by the etch back, and hence, is electrically conductive between a portion in the vicinity of the source region and a portion in the vicinity of the drain region.

Then, by using the gate electrode 3 and the conductive side wall 7a as masks, the n-type impurity ions are injected at a high concentration into the area which has been doped with the impurity at a low concentration, thereby forming high concentration source/drain regions 9a and 9b. As a result, the locations of the low concentration source/drain regions 5a and 5b and the high concentration source/drain regions 9a and 9b on the outer sides thereof are substantially defined.

Figure 6D:
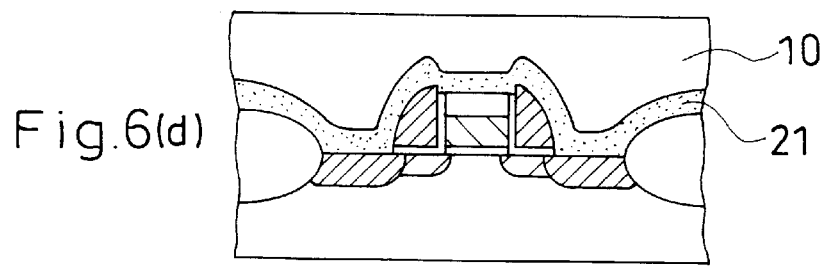

Next, in the procedure shown in FIG. 6(d), an entire protection film 21 of a silicon nitride film with a thickness of 100 nm and an interlayer insulating film 10 of a silicon oxide film with a thickness of approximately 700 nm are successively deposited on the entire surface of the resultant substrate.

Figure 6E:
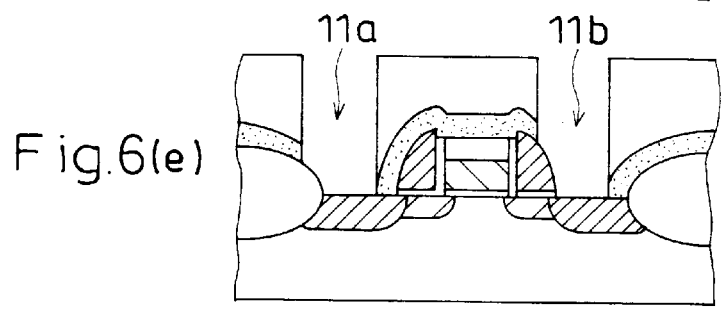

Then, in the procedure shown in FIG. 6(e), part of the interlayer insulating film 10 and the entire protection film 21 is selectively removed, so as to form first and second contact holes 11a and 11b reaching the high concentration source region 9a and the high concentration drain region 9b, respectively. At this point, the first contact hole 11a is formed so as not to come in contact with the conductive side wall 7a but to expose the high concentration source region 9a alone, while the second contact hole 11b is formed so as to expose both the high concentration drain region 9b and the conductive side wall 7a. The dimension of each of the contact holes 11a and 11b along the gate length is approximately 0.4 μm.

Figure 6F:
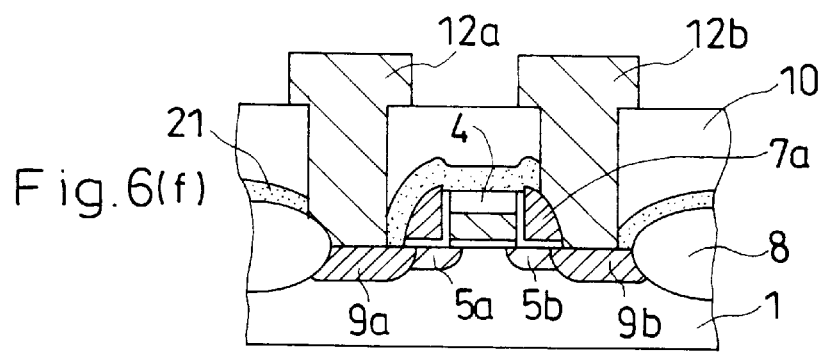

Next, in the procedure shown in FIG. 6(f), a metallic film of tungsten, aluminum or the like is deposited within the contact holes 11a and 11b and on the interlayer insulating film 10, and is selectively etched, thereby forming first and second interconnections 12a and 12b. At this point, the first interconnection 12a is in contact with the high concentration source region 9a alone, while the second interconnection 12b is in contact with both the high concentration drain region 9b and the conductive side wall 7a.

In the MOS semiconductor apparatus manufactured through the production procedures of this embodiment, since the second interconnection 12b is connected to the conductive side wall 7a, the drain electric field in the semiconductor substrate 1 is relaxed as in the first embodiment, thereby suppressing the characteristics of the semiconductor apparatus from degrading due to a hot carrier.

Additionally, the entire protection film 21 of the silicon nitride film having high etching selectivity against a silicon oxide film is deposited on the entire surface of the substrate in this embodiment. Therefore, even though the second contact hole 11b is formed on an area above the gate electrode 3, the second contact hole 11b does not reach the gate electrode 3. Specifically, since the etching selectivity between the silicon nitride film and the silicon oxide film is high, the silicon nitride film 21 serves as an etching stopper when the interlayer insulating film 10 of the silicon oxide film is subjected to the dry etching. After this, when the silicon nitride film 21 is etched with a different gas, the gate protection film 4 of the silicon oxide film serves as an etching stopper. Thus, the second contact hole 11b is prevented from reaching the gate electrode 3. As a result, the thickness at the bottom of the conductive side wall 7a can be set regardless of the alignment margin determined in consideration of the mask shift.

Furthermore, in the procedure shown in FIG. 6(e), when the contact holes 11a and 11b are formed in the vicinity of the source and drain regions, it is necessary to ultimately remove the entire protection film 21 of the silicon nitride film. At this point, even though the contact holes 11a and 11b are formed on areas above the isolation 8, the isolation 8 is scarcely etched and the reliability is not degraded because the etching selectivity of the silicon oxide film against the silicon nitride film is low. Therefore, there is no need to set an alignment margin between the contact holes 11a and 11b and the isolation 8. This also decreases the widths of the drain and source regions. In this manner, the MOS semiconductor apparatus of this embodiment can attain higher refinement and a higher density than the MOS semiconductor apparatus of the first embodiment.

Figure 7:
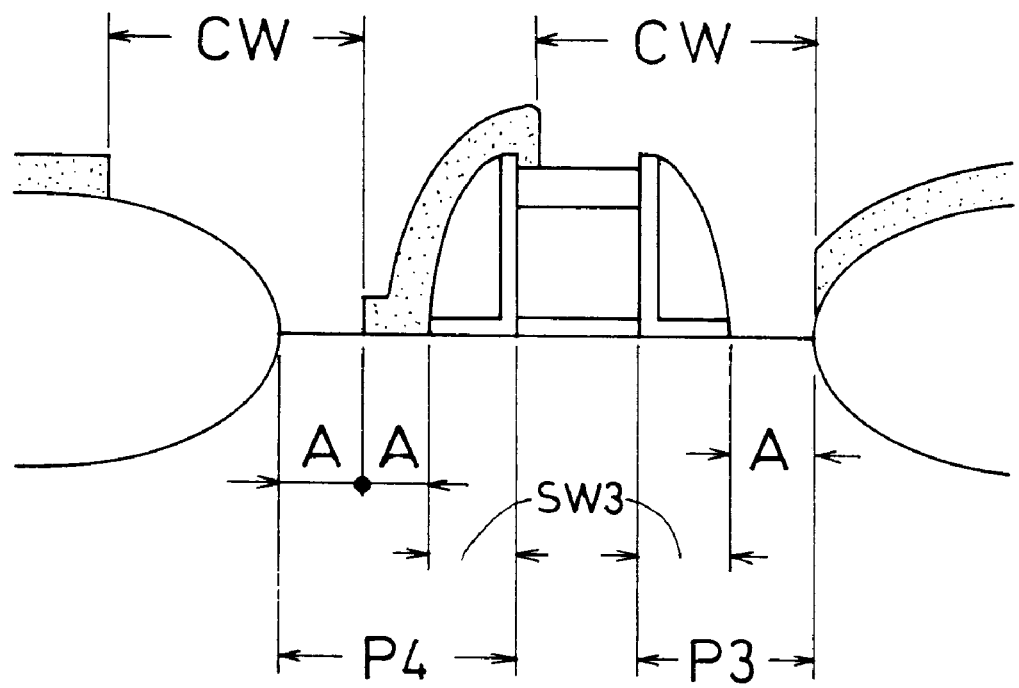
FIG. 7 is a sectional view for showing a width of a drain region required in the MOS transistor of the third embodiment.

FIG. 7 is a sectional view showing required widths of the source and drain regions of the MOS transistor of this embodiment. As is shown in FIG. 7, when the alignment margin is indicated similarly to the first embodiment as A and the thickness at the bottom of the conductive side wall 7a (the thickness of the side wall film) is indicated as SW3, a distance P3 between the edge of the gate electrode near the drain region and the edge of the isolation (that is, the width of the drain region) is required to satisfy the following relationship:

$$P3 \geq A + SW3$$

When this distance is compared with the distance P1 ($\geq$SW1+2A+CW) between the edges of the gate electrode near the drain region and the isolation in the conventional MOS transistor, the width of the drain region can be decreased in the present MOS transistor by the sum of the dimension CW of the contact hole and the alignment margin A, for the thickness SW1 of the side wall is substantially equal to the thickness SW3.

Specifically, when the dimension CW of the contact hole is 0.4 μm, the width of the side wall is 0.1 μm and the alignment margin A is 0.1 μm, the width P3 of the drain region is as small as 0.2 μm. This is remarkably smaller than 0.7 μm, that is, the distance P1 in the convention MOS transistor described referring to FIG. 3(a).

Furthermore, a distance P4 between the edge of the gate electrode near the source region and the edge of the isolation, that is, the width of the source region, is required to satisfy the following relationship:

$$P4 \geq 2A + SW3$$

The width of the source region in the convention MOS transistor is identical to the width P1 of the drain region shown in FIG. 3(a), and hence, the width of the source region can be decreased in the present transistor by the dimension CW of the contact hole. Specifically, the width P4 of the source region in the present MOS transistor can be decreased by approximately 0.4 μm as compared with that in the conventional MOS transistor.

Embodiment 4

Figure 8:
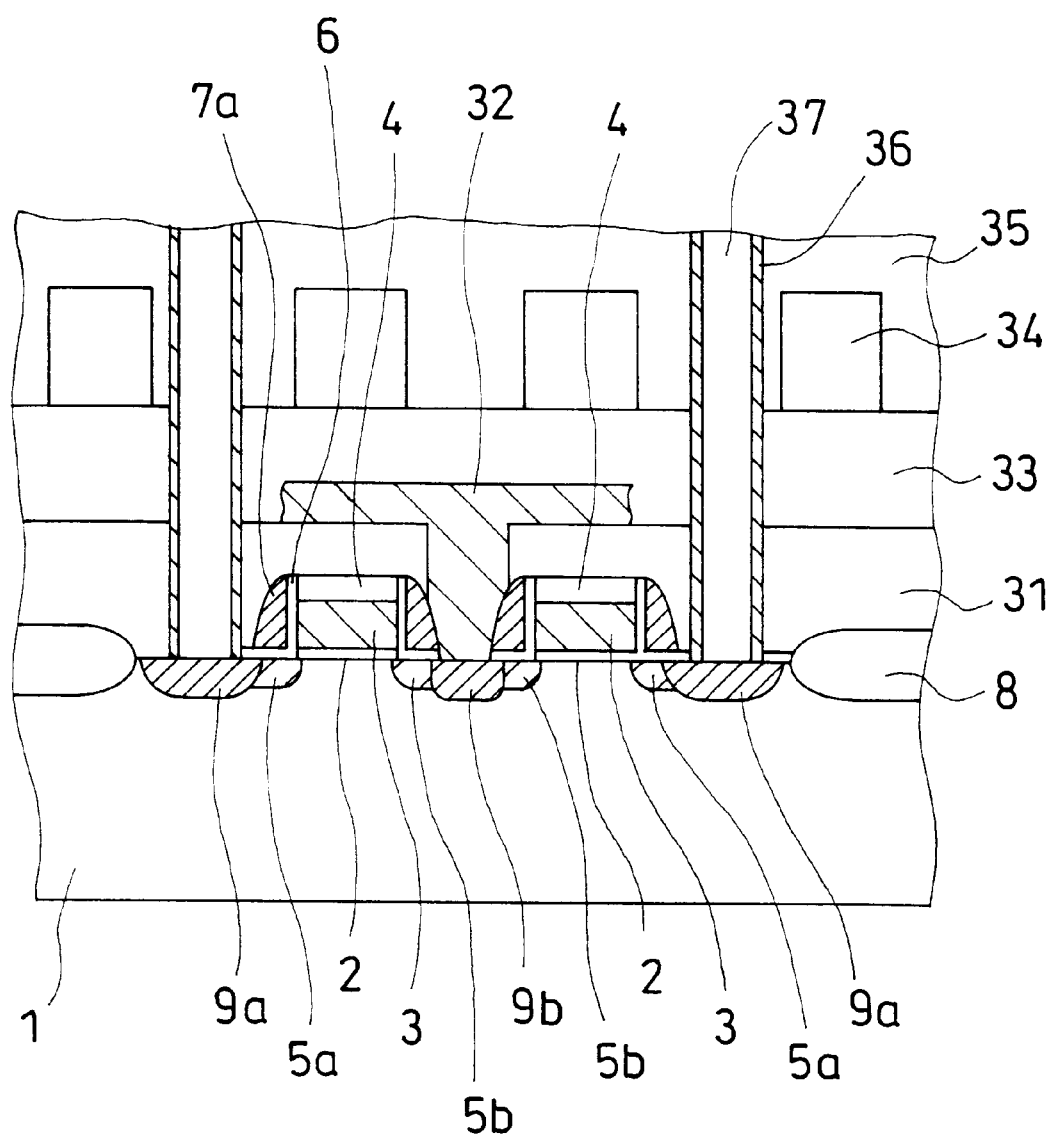
FIG. 8 is a sectional view of a DRAM memory cell of a fourth embodiment of the invention.

The fourth embodiment of the invention will now be described. The basic production procedures of this embodiment are the same as those of the first embodiment, and hence, the production procedures are not shown but merely the configuration of a completed MOS transistor of this embodiment will be described. FIG. 8 is a sectional view of a MOS transistor to be disposed in a memory cell portion of a DRAM according to this embodiment.

As is shown in FIG. 8, on an active area surrounded by an isolation 8 on a semiconductor substrate 1, two MOS transistors each having the same configuration as that of the first embodiment are formed. Specifically, each MOS transistor comprises a gate oxide film 2, a gate electrode 3, a gate protection film 4, a silicon oxide film 6, a conductive side wall 7a, low concentration source/drain regions 5a and 5b, and high concentration source/drain regions 9a and 9b. The high concentration drain region 9b is commonly used by these transistors. On the entire surface of the substrate is deposited a first interlayer insulating film 31, through which a second contact hole is formed so as to reach the high concentration drain region 9b and the conductive side wall 7a of each transistor. A bit wire 32 of a metallic film is formed within the second contact hole and on the first interlayer insulating film 31. On the substrate, a second interlayer insulating film 33, a first upper layer interconnection 34 and a third interlayer insulating film 35 are successively formed. A first contact hole is formed through these interlayer insulating films from an interlayer insulating film in a further upper layer (not shown) so as to reach the source region 9a of each transistor. Within the first contact hole are deposited a side wall protection film 36 and a capacity storage contact 37.

Also in this embodiment, the bit wire 32 is in contact with both the high concentration drain region 9b and the conductive side wall 7a, and hence, the effect to suppress the degradation caused by a hot carrier can be exhibited as in the first embodiment.

In addition, since the bit wire 32 is connected via one contact hole to the conductive side walls 7a of the two transistors on the sides of the contact hole, the width of the drain region formed between these transistors can be further decreased. This will be described in detail referring to FIGS. 9(a) and 9(b).

Figure 9A:
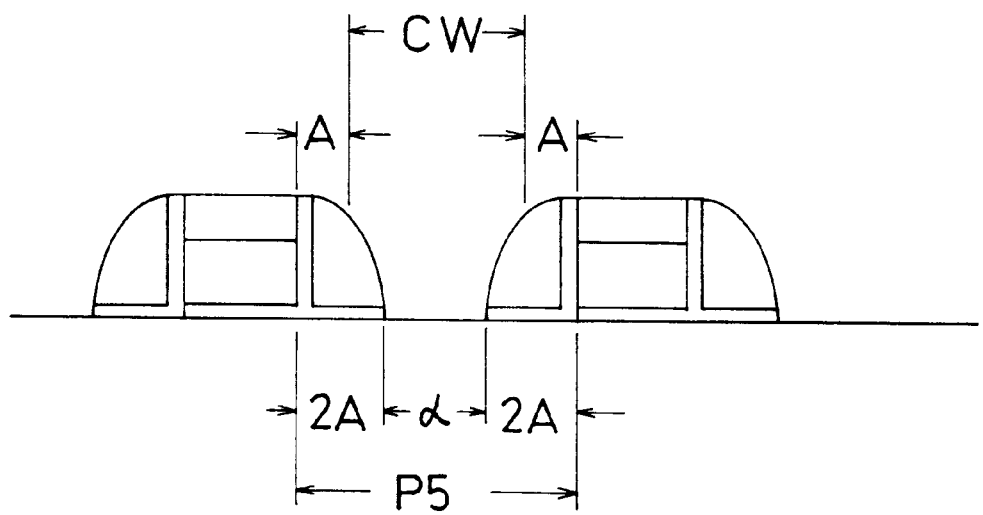
FIGS. 9(a) and 9(b) are sectional views for comparing widths of drain regions required in a MOS transistor of the DRAM memory cell of the fourth embodiment and a conventional DRAM memory cell.
Figure 9B:
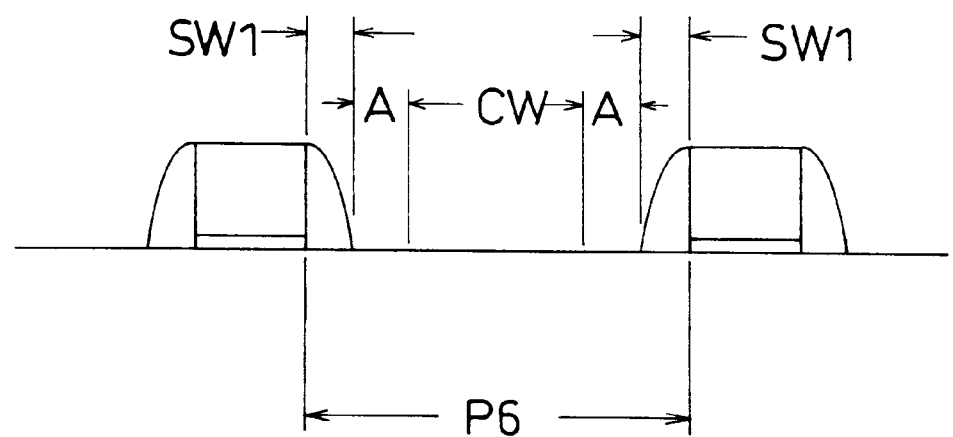

FIG. 9(a) shows the width of the drain region in the memory cell transistor of this embodiment, and FIG. 9(b) shows that in a memory cell transistor in a conventional DRAM. In this embodiment, a distance P5 between the edges of the gate electrodes of the adjacent transistors (that is, the width of the drain region) is required to satisfy the following relationship:

$$P5 \geq CW + 2A$$

Since the diameter CW of the contact hole (specifically, approximately 0.4 μm) is sufficiently larger than the twice of the alignment margin A, a distance a between the edges of the side walls shown in FIG. 9(a) is, for example, approximately 0.2 μm.

In the conventional memory cell transistor, a distance P6 between the edges of the gate electrodes of the transistors is required to satisfy the following relationship:

$P6 \geq CW+2A+2SW1$

Therefore, a difference between these distances is 2SW1. Thus, the width of the drain region can be decreased in this embodiment by the twice of the thickness SW1 of the side wall film.

Specifically, in the configuration where one drain region is commonly used by two transistors, the width of the drain region can be decreased by, for example, approximately 0.2 μm, that is, the twice of the width SW1 of the conventional side wall.

As described with regard to the first embodiment, the effect of this embodiment can be successfully exhibited when the conductive wall 7a has a thickness of 150 nm or more if a high production cost can be ignored. However, taking the alignment margin adopted in the current mass-production into consideration, the thickness of the conductive side wall 7a is more preferably 200 nm or more.

Other Embodiments

In the fourth embodiment, a gate protection film of a silicon nitride film can be formed on the gate electrode as in the second embodiment. In this case, there is no need to make the side wall have a thickness as large as 2A as shown in FIG. 9(a), and hence, the width P5 of the drain region can be further decreased by approximately 0.2 μm.

Furthermore, in the fourth embodiment, an entire protection film of a silicon nitride film can be formed below the interlayer insulating film as in the third embodiment. In this case, the width of the source region can be advantageously decreased similarly to the third embodiment.

In the first to third embodiments, an n-type MOS transistor is formed on a p-type silicon substrate, but the same effect can be attained by forming a p-type MOS transistor on an n-type silicon substrate.

Furthermore, in the first to third embodiments, the conductive side wall 7a can be used as a local interconnection. In this case, the area of the entire semiconductor apparatus can be further decreased.

In the aforementioned embodiments, the low concentration source/drain regions 5a and 5b are not indispensable. When the low concentration source/drain regions 5a and 5b are omitted, the effect to relax the drain electric field below the conductive side wall 7a can be efficiently exhibited.

In the second and third embodiments, even when the second contact hole 11b is formed over the gate electrode 3 so as to reach the conductive side wall 7a near the source region as well as near the drain region, there arises no problem as far as the second contact hole 11b reaches the high concentration drain region 9b.

What is claimed is:

1. A semiconductor apparatus comprising at least one n-type MOS transistor disposed on an active area surrounded by an isolation area formed on a semiconductor substrate, the n-type MOS transistor having a drain region and a source region, wherein a higher voltage is applied thereto the drain region than the source region, the n-type MOS transistor further including:

a gate insulating film formed in the active area surrounded by the isolation area on the semiconductor substrate;

a gate electrode formed on the gate insulating film, said gate electrode having side surfaces;

an insulating film formed so as to stretch over side surfaces of the gate electrode and the semiconductor substrate in the active area; and a side wall made of a conductive material formed on each of the side surfaces of the gate electrode with the insulating film interposed therebetween, said sidewall being a continuous film surrounding said gate electrode;

wherein the source region and the drain region are formed on both sides of the gate electrode by introducing an impurity into the active area, wherein the semiconductor apparatus is further provided with:

an interlayer insulating film formed on an area stretching over the gate electrode, the semiconductor substrate and the isolation area;

a first contact hole formed through the interlayer insulating film so as to reach the source region;

a second contact hole formed through the interlayer insulating film so as to reach the drain region and the conductive side wall; and first and second contact members of a conductive material deposited within the first and second contact holes, respectively.

2. The semiconductor apparatus of claim 1, wherein the side wall has a thickness at its bottom of 150 nm or more.

3. The semiconductor apparatus of claim 1, further comprising a gate protection film formed on the gate electrode and made of an insulating material having high etching selectivity against the interlayer insulating film, said gate protection film being an etch stopper.

4. The semiconductor apparatus of claim 1, further comprising a gate protection film formed on the gate electrode and made of an insulating material; and an entire protection film formed on the gate electrode, the active area and the isolation area, said protection film made of an insulating material having high etching selectivity against the isolation area and the gate protection film, wherein the first and second contact holes are formed through the interlayer insulating film and the entire protection film.

5. The semiconductor apparatus of claim 4, wherein the isolation area and the gate protection film are made of a silicon oxide film, and the entire protection film is made of a silicon nitride film.

* * * * *